United States Patent de Reynal et al.

[11] Patent Number: 5,201,456
[45] Date of Patent: Apr. 13, 1993

[54] PROCESS FOR ASSEMBLY OF A METAL CAN ON A SUBSTRATE BEARING AN INTEGRATED CIRCUIT

[75] Inventors: Florence de Reynal, St Mande; Dominique Coujard, Chilly Mazarin, both of France

[73] Assignee: Thomson-CSF, Puteaux, France

[21] Appl. No.: 774,346

[22] Filed: Oct. 10, 1991

[30] Foreign Application Priority Data

Oct. 12, 1990 [FR] France ............................. 90 12607

[51] Int. Cl.$^5$ ............................. H01J 9/26; B23K 1/20
[52] U.S. Cl. ................................... 228/122; 228/124; 427/229; 427/404; 445/44
[58] Field of Search ........... 228/122, 124, 120, 263.12, 228/203; 437/209, 221, 224; 427/214, 404, 229; 445/25, 44

[56] References Cited

U.S. PATENT DOCUMENTS

| | | | |
|---|---|---|---|
| 3,020,182 | 2/1962 | Daniels | 228/124 X |
| 4,338,380 | 7/1982 | Erickson et al. | 228/124 X |
| 4,704,626 | 11/1987 | Mahulikar et al. | 357/74 |

FOREIGN PATENT DOCUMENTS

| | | |
|---|---|---|
| 178481 | 4/1986 | European Pat. Off. |
| 1431919 | 3/1977 | United Kingdom . |
| 1468973 | 3/1977 | United Kingdom . |

OTHER PUBLICATIONS

Patent Abstracts of Japan, vol. 011, No. 023 (E-473) Jan. 22, 1987 & JP-A-61 193473 27 aout 1986.
Patent Abstracts of Japan, vol. 012, No. 111 (E-598) Apr. 8, 1988 & JP-A-62 241356 Oct. 22, 1987.
Patent Abstracts of Japan, vol. 009, No. 263 (E-351) Oct. 19, 1985 & Jp-A-60 110156 Jun. 15, 1985.

Primary Examiner—Kenneth J. Ramsey
Attorney, Agent, or Firm—Pollock, VandeSande & Priddy

[57] ABSTRACT

The invention concerns a process for assembly of two layers constituted of materials having different mechanical properties, and its application to hermetic enclosure of hybrid circuits.

The process according to the invention to assemble a layer of a material $M_1$ and a layer of a material $M_2$ is characterized by the fact that it consists in interposing between the two layers an intermediate layer constituted of a mixture of the material $M_1$ and the material $M_2$. This mixture is preferably constituted of 25% to 75% by weight of the material $M_1$ and 75% to 25% by weight of the material $M_2$.

The process according to the invention is particularly useful for the enclosure of integrated circuits and more particularly hybrid circuits, during the assembly of the metal can on the ceramic substrate bearing the circuit.

8 Claims, 1 Drawing Sheet

PROCESS FOR ASSEMBLY OF A METAL CAN ON A SUBSTRATE BEARING AN INTEGRATED CIRCUIT

BACKGROUND OF THE INVENTION

The present invention concerns the hermetic enclosure of hybrid circuits.

The problem of eliminating humidity in electronic devices, or at least restricting it, is a difficult one. The most common contaminating agent—and the one with the most damaging effect on the reliability of a discrete component or an integrated circuit is water from the surrounding environment. Humidity is likely to corrode the circuit contacts, an effect amplified by dissolution of ions. This effect is very serious on integrated circuits, and increases with the scale of integration, i.e. as the connections become smaller. One solution to this problem is to enclose the circuit in an atmosphere of inert gas, such as nitrogen, which must not leak away.

For high-performance applications in severe environments, such as military or space missions, electronic units comprising a base of insulating material and a metallic can are used. The can is hermetically sealed to the base, generally after degassing. The base of the unit constitutes the substrate of the circuit, for example of a multilayer hybrid circuit. It may be in ceramic. The metal can is formed by a frame topped with a cap. The frame may be a simple cylinder, or may be divided internally into separate sections.

The materials to be assembled to obtain such units have different characteristics. The substrate is of ceramic and supports a multilayer type circuit formed by serigraphy. The metal frame, on the other hand, has a coefficient of thermal expansion which is not perfectly matched to that of the ceramic. Moreover, they must be connected by a welded joint whose expansion coefficient is much higher than that of the materials to be assembled. To perform this welding, the metal must undergo a specific chemical or electrolytic treatment in order to ensure wettability. On the ceramic side, the multilayer circuit comprising strip conductors or tracks must be insulated from the metal part to avoid short-circuits. It is therefore necessary to apply a deposit of dielectric paste by serigraphy at the position of the metallic frame. Since the welding does not adhere to the dielectric material, a conducting metallic ink must be deposited on this dielectric material.

For small dimensions, mechanical stresses cause no fracturing at the interface of the assembly and sealing at the various interfaces remains satisfactory after extensive thermal cycling. However, at sizes greater than a few square centimeters, the interface between the dielectric and the metal is too fragile.

Studies performed by the Applicant have enabled significant reduction of the problem of the airtightness of such assemblies.

SUMMARY OF THE INVENTION

The object of the present invention is a process of assembly of a metal can on a substrate bearing an integrated circuit according to which successive deposits are made, by serigraphy, on an annular zone of the substrate around the perimeter of the can. These deposits are a layer of dielectric paste insulating strip conductors on the substrate from the metal can, then a layer of metallic ink whose purpose is to fix a layer of welding alloy enabling fixing of the metal can.

The invention is remarkable in that the process consists in also applying by serigraphy, between the layer of dielectric paste and the layer of metallic ink, an intermediate layer of a mixture of the dielectric paste and the metallic ink. The creation of this intermediate layer enables a gradual transition of mechanical characteristics, ensuring better cohesion on both sides of this layer.

BRIEF DESCRIPTION OF THE DRAWING

The process of the present invention is explained in detail by the non-restrictive example below.

Figure 1:
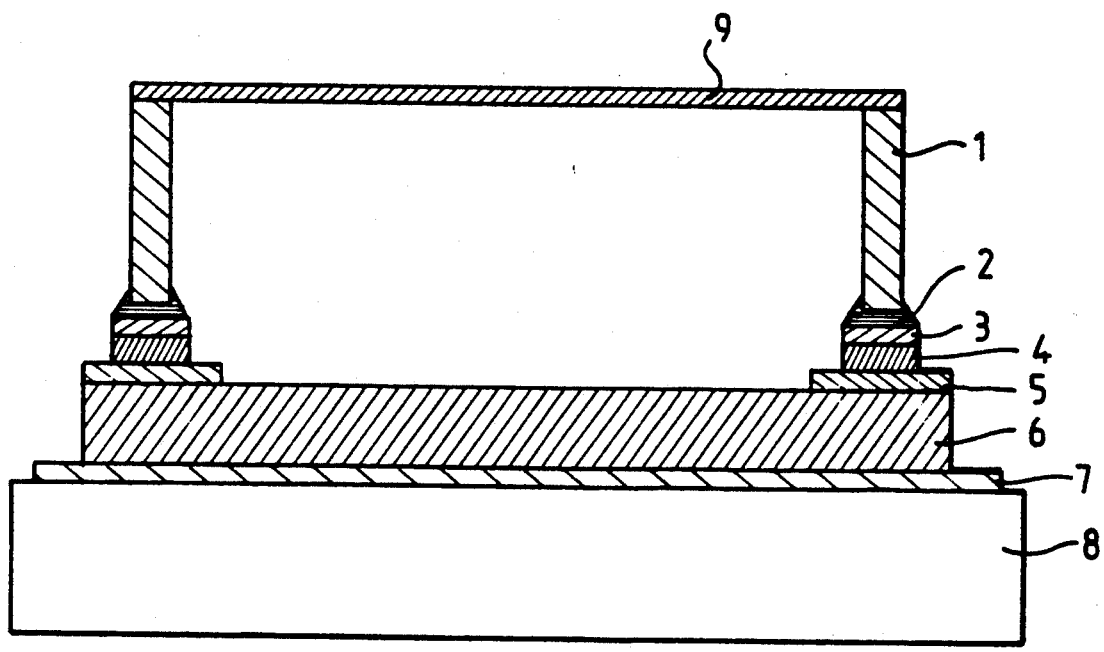
FIG. 1 represents a section view of a can obtained by the process of the invention. In this figure.

(1) represents a metal frame supporting a cap (9), this assembly forming the metal can;
(2) represents a layer of welding alloy;
(3) represents a metallic layer;
(4) represents an intermediate layer;
(5) represents a dielectric layer;
(6) represents a multilayer circuit;
(7) represents the input/output tracks;
(8) represents the substrate serving as the base of the unit.

MORE DETAILED DESCRIPTION

The substrate (8) is advantageously constituted of a ceramic such as alumina. It bears a circuit of the multilayer serigraphied type (6) and input/output tracks (7).

The annular multilayer zone (6) on which the metal frame (1) must be fixed is covered by serigraphy with a layer of dielectric paste (5). The dielectric material may be of glass, for example barium or lead silicoboroaluminate, and of alumina.

The intermediate layer (4) is obtained by depositing on the annular dielectric layer (5), by serigraphy, a raw paste mixture constituted of the dielectric serigraphy paste as used for the layer (5) and of a metallic serigraphy ink. The mixture thus deposited is dried and fired using conventional techniques. The thickness of the layer (4) is preferably of the order of 20 $\mu$.

The mixture is preferably constituted of 25% to 75% of dielectric serigraphy paste and 75% to 25% of metallic serigraphy ink. An approximately 50/50 mixture is particularly preferred.

The metal layer is then formed by serigraphy on the aforementioned annular zone using a metallic serigraphy ink identical to that used for the intermediate layer (4). This ink may be a gold, gold-platinum or silver-palladium ink.

The annular zone then receives a layer of welding alloy (2) and an annular metal frame (1) is fixed on the zone covered with welding alloy by melting the welding alloy.

Finally, a cap (9) is hermetically sealed to the frame (1), for example by laser welding.

A unit comprising a substrate with a surface area of over 1 dm$^2$ has been built in this way. Its airtightness and its resistance to environmental conditions of temperature and low pressure according to military standards have been verified.

Moreover, a unit constituted of layers to 8 according to the invention, and a unit including layers 1 to 3 and 5 to 8 according to the prior art have been subjected to traction and shear tests. For the assembly according to the invention, the maximum resistance is 92 kg/cm$^2$. For the assembly according to the prior art, it is 55 kg/cm². In addition, rupture no longer occurs between the dielectric layer and the metallic layer, but at the ceramic. It thus appears that the process according to the invention provides significant reinforcement of the assembly between two layers of different materials.

What is claimed is:

1. Process for assembly of a metal can on a substrate bearing an integrated circuit according to which successive applications by serigraphy are made, on a annular zone of the substrate around the perimeter of the can, of a layer of dielectric paste insulating strip conductors on the substrate from the metal can, then a layer of metallic ink serving to adhere to a layer of welding alloy enabling welding of the metal can, which further comprises applying a mixture of the dielectric paste and the metallic ink by serigraphy as an intermediate layer between said layer of dielectric paste and said layer of metallic ink.

2. Process according to claim 1, wherein the mixture used for the intermediate layer is constituted of 25% to 75% by weight of the said dielectric paste and of 75% to 25% by weight of the said metallic ink.

3. Process according to claim 1, wherein the mixture used for the intermediate layer is constituted of approximately 50% by weight of the said dielectric paste and of approximately 50% by weight of the said metallic ink.

4. Process according to claim 1, wherein the said dielectric paste is a glass constituted of alumina and barium or lead silicoboroaluminate.

5. Process according to claim 1, wherein the said metallic ink is constituted of a metal or alloy chosen from among gold, gold-platinum or silver-palladium.

6. The process of claim 1 wherein said substrate is a ceramic.

7. The process of claim 1 wherein said substrate is alumina.

8. The process of claim 1 wherein said intermediate layer is about 20µ in thickness.

* * * * *